(12) United States Patent
Ishida

(10) Patent No.: US 6,940,290 B2
(45) Date of Patent: Sep. 6, 2005

(54) SENSOR OUTPUT PROCESSING DEVICE HAVING SELF-DIAGNOSIS FUNCTION

(75) Inventor: Shoichi Ishida, Obu (JP)

(73) Assignee: Denso Corporation, Kariya (JP)

( * ) Notice: Subject to any disclaimer, the term of this patent is extended or adjusted under 35 U.S.C. 154(b) by 211 days.

(21) Appl. No.: 10/374,500

(22) Filed: Feb. 27, 2003

(65) Prior Publication Data

US 2003/0164711 A1 Sep. 4, 2003

(30) Foreign Application Priority Data

Mar. 1, 2002 (JP) .......................... 2002-055831

(51) Int. Cl.[7] .................. G01R 27/02; G01R 31/02
(52) U.S. Cl. ................ 324/609; 324/537; 340/660
(58) Field of Search ................. 324/609, 610, 324/611, 705, 706, 537; 361/91.1, 92; 340/660–663, 653–654, 500; 327/180

(56) References Cited

U.S. PATENT DOCUMENTS

| | | | | |
|---|---|---|---|---|
| 5,296,997 A | * | 3/1994 | Betton et al. | 361/92 |
| 5,734,269 A | * | 3/1998 | Sakai et al. | 324/706 |
| 5,847,260 A | * | 12/1998 | Nagahara | 73/1.01 |
| 6,040,779 A | * | 3/2000 | Pfaff et al. | 340/661 |
| 6,518,880 B2 | * | 2/2003 | Tanizawa | 340/514 |

* cited by examiner

Primary Examiner—Anjan Deb
Assistant Examiner—Jeff Natalini
(74) Attorney, Agent, or Firm—Posz Law Group, PLC

(57) ABSTRACT

A sensor output processing device has an amplifier circuit for amplifying a sensor output signal of a sensor and a buffer circuit for limiting the amplified signal to a high limit level lower than a high side voltage of a power source or a low limit level higher than a low side voltage of the power source. This limited signal is normally produced as an output signal to an external circuit. When a self-diagnosis circuit determines an abnormality in the sensor or in the amplifier circuit and the buffer circuit, the output signal is fixed to a level higher than the high limit level or lower than the low limit level.

5 Claims, 3 Drawing Sheets

SENSOR OUTPUT PROCESSING DEVICE HAVING SELF-DIAGNOSIS FUNCTION

CROSS REFERENCE TO RELATED APPLICATION

This application is based on and incorporates herein by reference Japanese Patent Application No. 2002-55831 filed on Mar. 1, 2002.

FIELD OF THE INVENTION

The present invention relates to a sensor output processing device which has a self-diagnosis function.

BACKGROUND OF THE INVENTION

A conventional sensor output processing device has a signal limiter which limits the output signal of the processing device to be within a predetermined signal range, for instance to the range from a low limit level (0.5 volts) to a high limit level (4.5 volts), although the device is operable to produce the output signal from the low side voltage (0 volt) to the high side voltage (5 volts) of a power source. That is, the output signal is limited to be different from the power source voltages (0 volts and 5 volts).

It is proposed to provide this processing device with a self-diagnosis function which continues to limit the output signal to the predetermined limit, 0.5 or 4.5 volts, when any abnormality in a sensor or its electronic signal processing circuit is detected. If the output signal from the signal processing circuit continues to be at the limit level, an external device, which receives the output signal thus continuously limited, recognizes that the sensor or the processing circuit has an abnormality. In this instance, however, it is difficult for the external circuit to determine whether the output signal is limited to the limit level in the normal operation or the output signal is maintained at the limit level due to abnormality in the sensor. Therefore, it is desired to provide a predetermined signal margin ΔV between the limit level of the output signal and a diagnosis signal indicative of abnormality. This signal margin will narrow the signal range in which the output signal is allowed to vary.

SUMMARY OF THE INVENTION

It is therefore an object of the present invention to provide an improved sensor output processing device that produces an output signal that enables an external circuit to recognize an abnormality accurately.

According to the present invention, a sensor output processing device has a signal processing circuit and a self-diagnosis circuit. The signal processing circuit amplifies a sensor output signal produced by a sensor and produces an output signal variable with the sensor output signal. The self-diagnosis circuit diagnoses operations of at least one of the sensor and the signal processing circuit based on potentials therein and produces an abnormality determination signal indicative of an abnormality. The signal processing circuit limits the output signal to be lower than a high limit level lower than the high side voltage of a power source or higher than a low limit level higher than the low side voltage of the power source, when no abnormality determination signal is produced by the self-diagnosis circuit. However, the signal processing circuit fixes the output signal to be higher than the high limit level or lower than the low limit level, when the abnormality determination signal is produced by the self-diagnosis circuit.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENT (First Embodiment)

Figure 1:
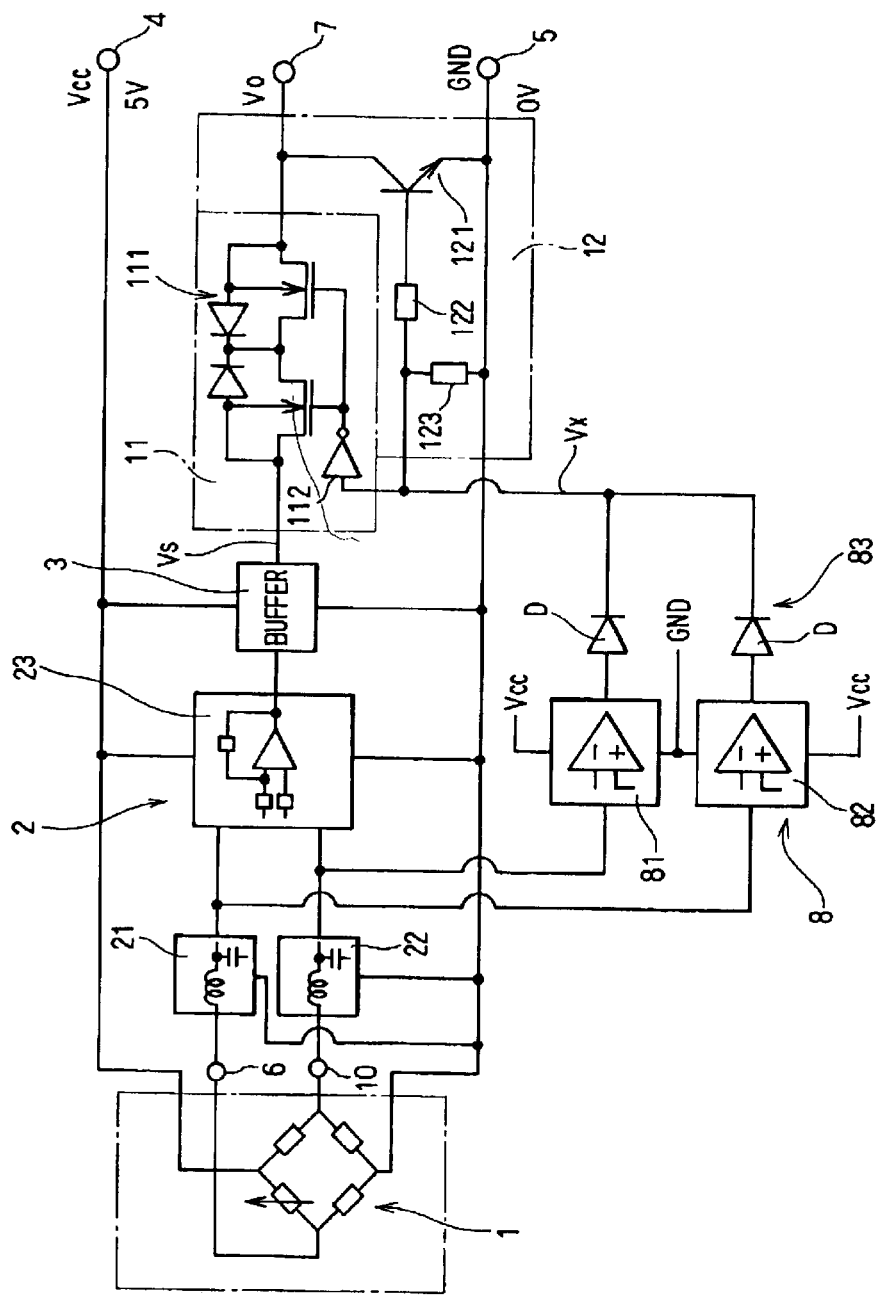
FIG. 1 is a circuit diagram showing a sensor output processing device according to the first embodiment of the present invention.

Referring first to FIG. 1, a sensor output processing device is connected to a load sensor 1 through signal input terminals 6 and 10. The sensor 1 uses a strain gauge in an arm of a Wheatstone bridge circuit, and may be provided on a seat of a vehicle to detect seating of a vehicle passenger.

The sensor output processing device includes an electronic signal processing circuit that is composed of an amplifier circuit 2, a current buffer circuit 3, an analog switch circuit 11 and a clamp switch circuit 12. The device further includes a self-diagnosis circuit 8. Those circuits 2, 3, 8, 11 and 12 are connected to power supply terminals 4 and 5 to be supplied with a power source voltage (high side voltage Vcc=5 volts) relative to the ground voltage (low side voltage GND=0 volt). The buffer circuit 3 is connected to an output terminal 7 through the analog switch circuit 11 and the clamp switch circuit 12. The output terminal 7 is connected to an external device (not shown).

The amplifier circuit 2 includes a pair of low pass filters 21 and 22, and a linear voltage amplifier 23 that includes an analog voltage amplifier. The filters 21 and 22, each being constructed of a choke coil and a capacitor, cut off high frequency signal components of the differential voltages produced by the sensor 1. The amplifier 23 differentially and linearly amplifies the output voltages produced by the filters 21 and 22 as shown by the solid line in FIG. 2. The current buffer circuit 3 amplifies a current corresponding to the output voltage of the amplifier 23 and outputs it as a current voltage Vs from the output terminal 7. However, the buffer circuit 3 limits the dynamic range of the current voltage Vs to be between a low limit level (Vl=0.5 volts) and the high side voltage (5.0 volts) of the power source. This low limit level is 0.5 volts higher than the power source voltage (GND=0). This limited voltage Vs is shown with the dotted line in FIG. 2.

It is noted that the filters 21 and 22 may be eliminated if noise components are not so critical. The buffer circuit 3 may be eliminated, if the effective dynamic range of the amplifier 23 is set so that the output voltage of the amplifier 23 changes linearly only between the limit level (0.5 volts) and the power source voltage (Vcc=5.0 volts) in relation to the input differential voltage.

The self-diagnosis circuit 8 includes a pair of voltage abnormality determination circuits 81 and 82, and a pair of diodes D that forms a diode OR-circuit 83. The determination circuits 81 and 82 have respective comparators that determine whether the voltages produced by the filters 21 and 22 are within a predetermined normal range (from 2 volts to 3 volts). The OR-circuit 83 produces an abnormality determination voltage Vx of high level (5 volts) when either of the determination circuits 81 and 82 determines abnormality.

The analog switch circuit 11 is connected between the buffer circuit 3 and the output terminal 7, and includes a pair of MOSFETs 111 and an inverter 112 that inverts the voltage Vx of the self-diagnosis circuit 8. The MOSFETs 111 are connected in series and in opposite polarities to be resistive in both polarities.

The clamp switch circuit 12 includes a clamp transistor 121 connected between the ground terminal 5 and the output terminal 7, a base current limit resistor 122 and a bias resistor 123. The transistor 121 is turned on to short the terminals 5 and 7, that is, to fix the output voltage Vo to 0 volt (GND) irrespective of the voltage Vs, in response to the voltage Vx indicative of the abnormality.

In operation, when the differential voltage produced from the sensor 1 as the sensor output voltage is in the normal range (2.0 to 3.0 volts), the voltage Vx of the self-diagnosis circuit 8 remains low and the analog switch circuit 11 (MOSFETs 111) is held turned on. As a result, the sensor output voltage is proportionally amplified by the amplifier circuit 23, limited to be within the predetermined range (0.5–5.0 volts) by the buffer circuit 3 and applied to the output terminal 7 through the analog switch circuit 11.

If the sensor 1 fails to operate normally due to shorting or disconnection, the sensor output voltage will remain close to the power source voltage (Vcc or GND). In this instance, one of the voltages applied to the self-diagnosis circuit 8 will exceeds beyond the normal range. The self-diagnosis circuit 8 produces the voltage Vx of high voltage. This voltage Vx turns off the analog switch circuit 11 (MOSFETs 111) and turns on the clamp switch circuit 12 (transistor 121). Thus, the output voltage Vo is fixed to the low side voltage (0 volt) of the power source irrespective of the voltage Vs. With this output voltage Vo being fixed to be lower than the low limit level (Vl=0.5 volts), the external device connected to the output terminal 7 is enabled to detect abnormality of the sensor 1.

Figure 2:
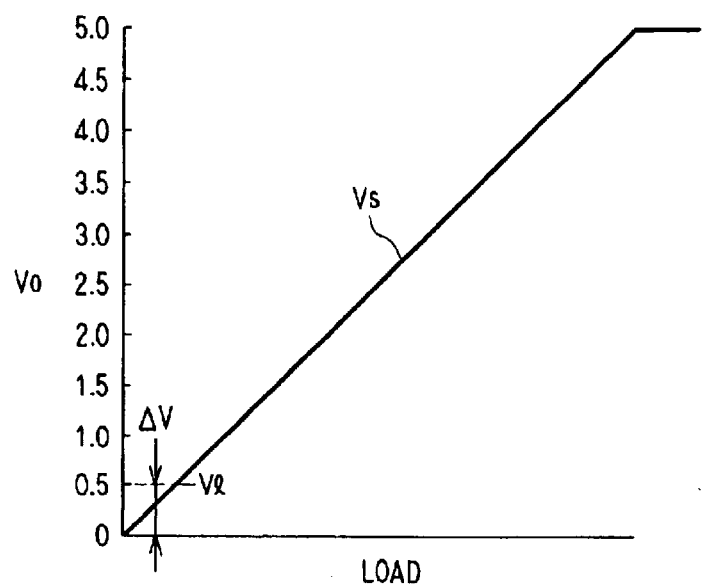
FIG. 2 is a characteristic graph showing a relation between a physical parameter and an output signal in the first embodiment.

According to the first embodiment, as shown in FIG. 2, the output voltage Vo is varied proportionally between the limit level (Vl=0.5 volts) and the power source voltage (Vcc=5.0 volts) in correspondence with the sensor output voltage (load applied to the sensor 1). However, the output voltage Vo is fixed to the low side power supply voltage (GND=0 volt) when an abnormality occurs. As a result, since the fixed voltage (0 volt) has a margin (ΔV) of 0.5 volts from the low limit level Vl (0.5 volts), the external circuit is enabled to recognize the abnormality accurately.

Figure 3:
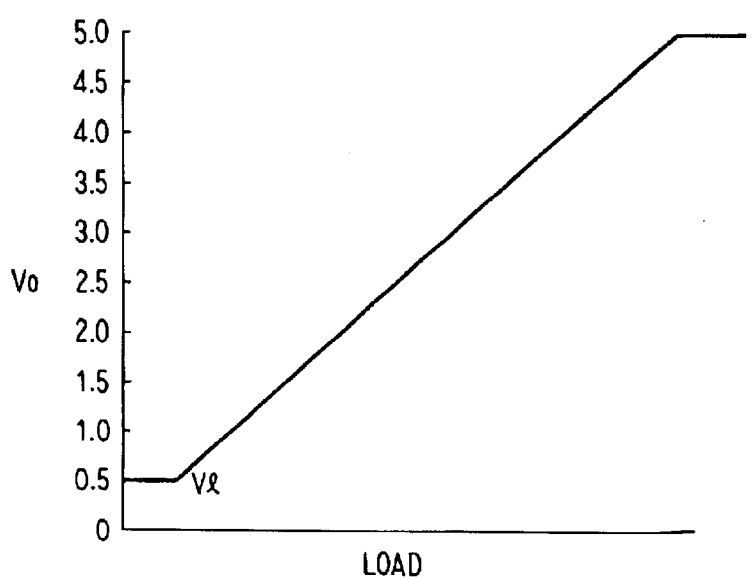
FIG. 3 is a characteristic graph showing another relation between the physical parameter and the output signal in a modification of the first embodiment.

In the first embodiment, another self-diagnosis circuit may be provided so that abnormality of the electronic circuits such as the amplifier circuit 2 other than the sensor 1 may be determined and the output voltage Vo is responsively fixed to 0 volt. In addition, the amplifier 23 may be constructed to saturate at the low limit level Vl, so that the output voltage Vo is limited to the low limit level (0.5 volts) as shown in FIG. 3. In this instance, the buffer circuit 3 may be eliminated or may be constructed as a simple current signal processing circuit having no voltage limit function.

Further, in place of the low limit level Vl, a high limit level (Vh=4.5 volts) may be used to limit the output voltage Vs to vary between the low side voltage (GND=0 volt) of the power source and the high limit level Vh which is 0.5 volts lower than the high side voltage (Vcc=5.0 volts) of the power source. In this instance, the output voltage Vo should be changed to the high side voltage (Vcc=5.0 volts). In either instance where the output voltage Vo is limited by the low limit level Vl or the high limit level Vh, the processing device is allowed to have a dynamic range of 4.5 volts which is larger than that (4.0 volts) of the conventional device.

(Second Embodiment)

Figure 4:
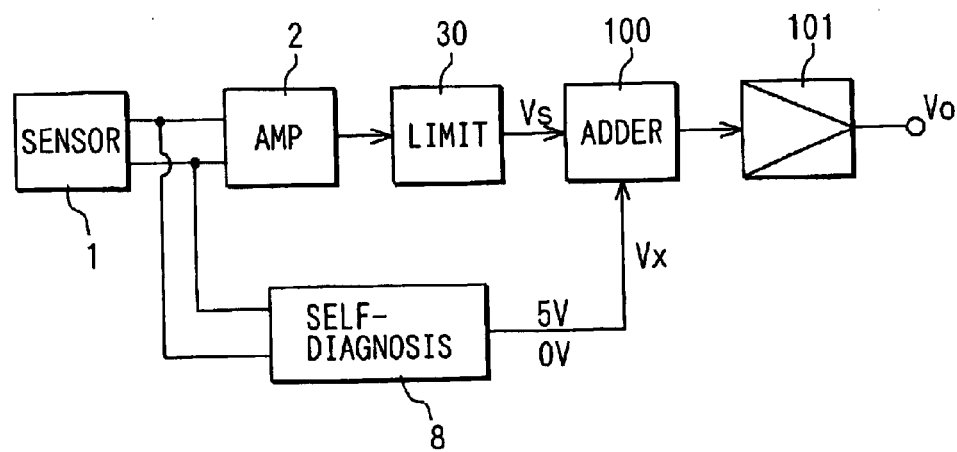
FIG. 4 is a circuit diagram showing a sensor output processing device according to the second embodiment of the present invention.

According to the second embodiment, as shown in FIG. 4, the sensor output processing device includes a voltage limiter circuit 30, an adder circuit 100 and a current buffer circuit 101 in addition to the amplifier circuit 2 and the self-diagnosis circuit 8, which are connected to the sensor 1 in a similar manner as in the first embodiment. The voltage limiter circuit 30 limits the output voltage of the amplifier circuit 2, and produces the voltage Vs varying only within the limit levels Vl (0.65 volts) and Vh (4.35 volts), when the amplifier output voltage falls below the low limit level (0.65 volts) and rises above the high limit level (4.35 volts). The self-diagnosis circuit 8 determines abnormality of the sensor 1, and produces the abnormality determination voltage Vx of high level (5 volts) when the abnormality is determined. This voltage Vx is low (0 volt), when no abnormality is determined.

The adder circuit 100 is composed of an operational amplifier, and sums up two voltages Vs and Vx. If no abnormality is determined by the self-diagnosis circuit 8, the output voltage of the adder circuit 100 and hence the output voltage Vo of the current buffer circuit 101 equals the output voltage Vs of the limiter circuit 30, because the voltage Vx is 0 volt. That is, the output voltage Vo changes in the range between the limit levels (0.65 volts and 4.35 volts). If an abnormality is determined, on the other hand, the operational amplifier of the adder circuit 100 saturates because the sum of the voltages Vs and Vx exceeds the power supply voltage(Vcc=5 volts). As a result,the output voltage Vo remains at the fixed voltage (high side power supply voltage Vcc=5 volts), which is differentiated from the normal output voltage range between the limit levels (0.65 volts to 4.35 volts).

According to the second embodiment, the sensor output processing device can be constructed in a bipolar transistor integrated circuit configuration. This is advantageous in that no MOSFETs such as the MOSFETs 111 (first embodiment), which need high gate voltages to be driven, are required.

In the second embodiment, the amplifier circuit 2 may be constructed to produce a saturated output thereby eliminating the voltage limiter circuit 30. The adder circuit 100 may be constructed to produce the output voltage in the polarity opposite to that of the second embodiment. That is, the adder circuit 100 may produce the inverted output voltage (0 volt), when an abnormality is determined by the self-diagnosis circuit 8. The current buffer 101 may be constructed in the output inverting type configuration, or may be eliminated.

Further, in the second embodiment, the adder circuit 100 may be modified to a subtractor circuit constructed with an operational amplifier, which receives the voltages Vs and Vx at its inverting input terminal (−) and non-inverting input terminal (+), respectively.

(Third Embodiment)

Figure 5:
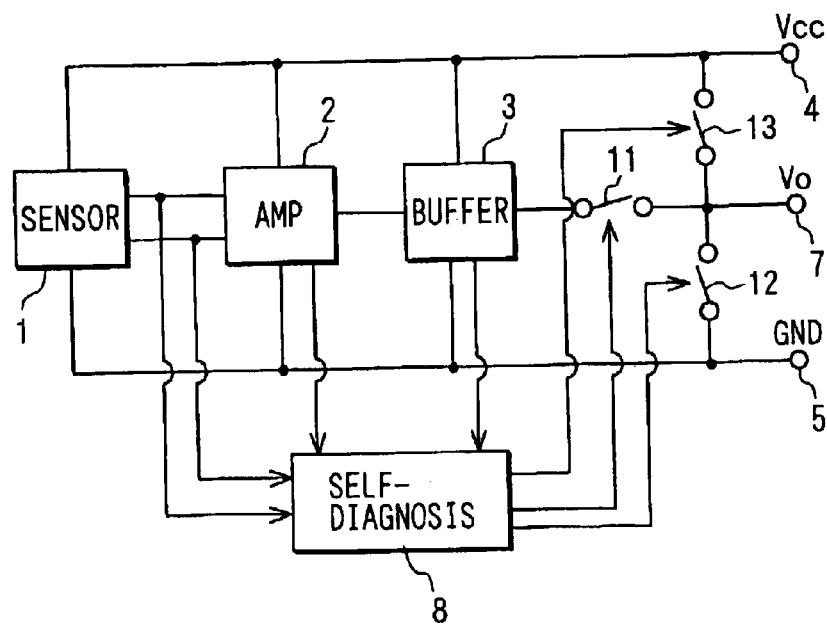
FIG. 5 is a circuit diagram showing a sensor output processing device according to the third embodiment of the present invention.

In the third embodiment, as shown in FIG. 5, the self-diagnosis circuit 8 is connected to the signal processing circuit 2 and the current buffer circuit 3, so that the self-diagnosis circuit 8 also monitors operations of the circuits 2 and 3 in addition to the operation of the sensor 1. Further, a clamp switch circuit 13 is connected between the high voltage side power supply terminal 4 and the output terminal 7.

In operation, if the self-diagnosis circuit 8 determines no abnormality, it turns on the analog switch circuit 11 and turns off both clamp switches 12 and 13 so that the output voltage Vo variable with the sensor voltage is produced from the output terminal 7 in the same manner as in the first embodiment. If the self-diagnosis circuit 8 determines an abnormality of the sensor 1, it turns on the clamp switch circuit 12 and turns off the analog switch circuit 11 in the same manner as in the first embodiment, so that the output voltage Vo is fixed to the low side power supply voltage GND (0 volt) irrespective of variations in the sensor voltage. If the self-diagnosis circuit 8 determines an abnormality in the amplifier circuit 2 or the current buffer circuit 3, it turns on the clamp switch circuit 13 and turns off the analog switch circuit 11 and the clamp switch circuit 12, so that the output voltage Vo is fixed to the high side power supply voltage Vcc (5 volts), which indicates an abnormality in the circuits 2 and 3 of the sensor output processing circuit other than the sensor 1.

According to the third embodiment, the external circuit is enabled to distinguish abnormalities of the sensor 1 and the processing device based on the fixed signal level of the output signal Vo. Therefore it is possible to replace only the sensor 1 or the processing device in failure, as far as the sensor 1 and the processing device are constructed separably.

In the above embodiments, it is preferred to configure the circuits 2, 3, 8, 11, 12, 13, 30, 100 and 101 in common to various kinds of sensors and provide therein adjusting terminals for manually or automatically adjusting sensitivity (amplification gain) and offset voltage.

The present invention should not be limited to the above embodiments, but may be implemented in many other ways without departing form the spirit of the invention.

What is claimed is:

1. A sensor output processing device for a sensor comprising:
   a pair of power supply terminals for supplying a high side voltage and a low side voltage, respectively, to provide a power voltage;
   a signal processing circuit, operable with the power voltage, for amplifying a sensor output signal produced by the sensor and producing a circuit output signal variable with the sensor output signal;
   an output terminal for applying the circuit output signal to an external circuit; and
   a self-diagnosis circuit, operable with the power voltage, for diagnosing operations of at least one of the sensor and the signal processing circuit based on potentials therein and producing an abnormality determination signal indicative of an abnormality,
   wherein, if the circuit output signal exceeds a high limit level lower than the high side voltage or is lower than a low limit level higher than the low side voltage, and irrespective of the sensor output signal, the signal processing circuit limits the circuit output signal to either the high limit level lower than the high side voltage or the low limit level higher than the low side voltage, when no abnormality determination is produced by the self-diagnosis circuit, and
   wherein the signal processing circuit fixes the circuit output signal to be a fixed level higher than the high limit level or lower than the low limit level, when the abnormality determination signal is produced by the self-diagnosis circuit.

2. The sensor output processing device as in claim 1, wherein the signal processing circuit includes a limiter that limits the circuit output signal to the limit level.

3. The sensor output processing device as in claim 1, wherein the signal processing circuit includes a clamp switch that is turned on in response to the abnormality determination signal to short the output terminal to one of the power supply terminals thereby fixing the circuit output signal to the high side voltage or the low side voltage.

4. The sensor output processing device as in claim 1, wherein the signal processing circuit includes an analog switch that is connected to the output terminal and turned off in response to the abnormality determination signal thereby disabling the circuit output signal that is variable between the high limit level and the low limit level from being applied to the output terminal.

5. The sensor output processing device as in claim 1, wherein the signal processing circuit includes an adder circuit that sums up the abnormality determination signal and the circuit output signal.

* * * * *